United States Patent [19]

Eizenberg et al.

[11] Patent Number: 4,502,209
[45] Date of Patent: Mar. 5, 1985

[54] FORMING LOW-RESISTANCE CONTACT TO SILICON

[75] Inventors: Moshe Eizenberg, Kiryat-Ata, Israel; Shyam P. Murarka, New Providence, N.J.

[73] Assignee: AT&T Bell Laboratories, Murray Hill, N.J.

[21] Appl. No.: 528,074

[22] Filed: Aug. 31, 1983

[51] Int. Cl.³ .......................................... H01L 23/48
[52] U.S. Cl. ...................................... 29/589; 29/571; 29/578; 427/88; 148/1.5; 357/67; 357/71
[58] Field of Search ................. 29/571, 578, 589, 590, 29/591; 357/67, 71; 427/88, 89, 90, 91; 148/1.5

[56] References Cited

U.S. PATENT DOCUMENTS 3,714,520  1/1973  Engeler et al. ...................... 357/71
3,794,516  2/1974  Engeler et al. .................... 357/71 X
3,879,746  4/1975  Fournier ............................... 357/71

OTHER PUBLICATIONS

"Interaction of Reactively Sputtered Titanium Carbide Thin Films with Si, $SiO_2Ti$, $TiSi_2$, and Al", *J. Appl. Phys.*, 54(6), Jun. 1983, M. Eizenberg et al, pp. 3195-3199.

*Primary Examiner*—Brian E. Hearn
*Assistant Examiner*—David A. Hey
*Attorney, Agent, or Firm*—Lucian C. Canepa

[57] ABSTRACT

Annealing a titanium-rich carbide film deposited on silicon produces, in a single processing step, both a stable titanium silicide contact and a titanium carbide diffusion barrier between the silicide and a subsequently formed overlying layer of aluminum. Reliable low-resistance contacts to VLSI devices are thereby provided in a cost-effective fabrication sequence.

Other metallization systems, comprising a silicide and a diffusion barrier to aluminum formed in a single processing step, are also described.

9 Claims, 5 Drawing Figures

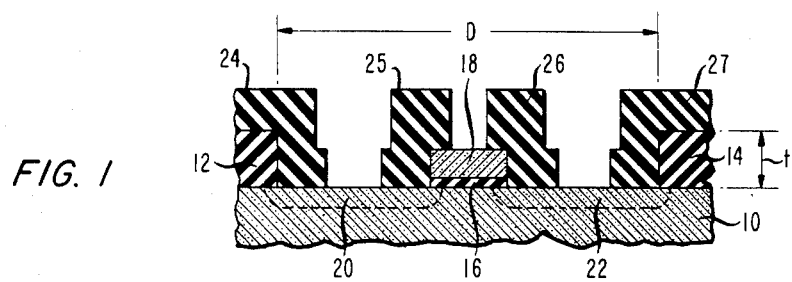
FIG. 1
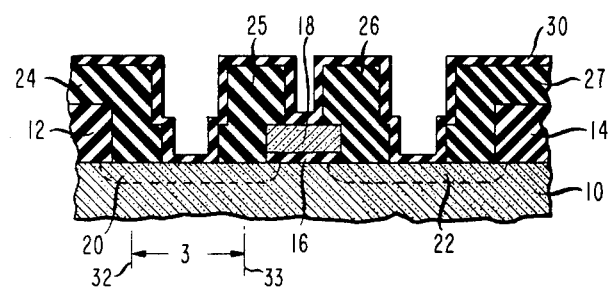
FIG. 2
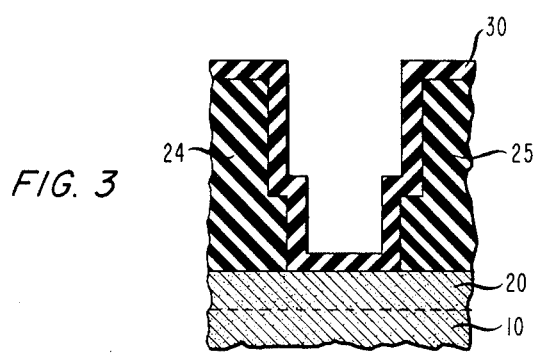
FIG. 3
FIG. 4
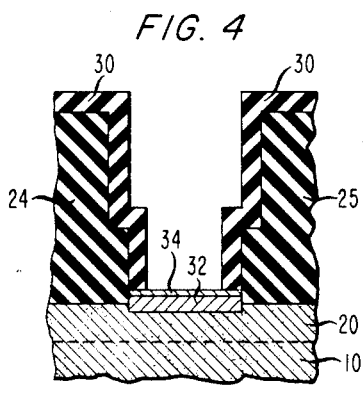
FIG. 5
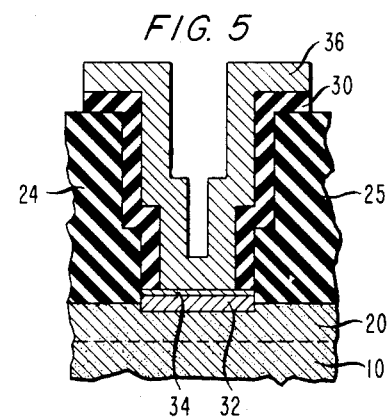

FORMING LOW-RESISTANCE CONTACT TO SILICON

BACKGROUND OF THE INVENTION

This invention relates to the fabrication of integrated circuit devices and, more particularly, to a method for forming low-resistance contact to silicon in very-large-scale-integrated (VLSI) devices.

It is known to utilize a silicide on silicon to achieve high-conductivity contacts and interconnects in metal-oxide-semiconductor (MOS) VLSI devices. It is also known to interpose a diffusion barrier between the silicide and an overlying aluminum layer to prevent silicide-aluminum or silicon-aluminum interactions. In that way, the likelihood of the multilayer metallization causing harmful effects such as penetration and shorting of extremely shallow junctions in such devices is minimized.

Heretofore, the silicide and diffusion barrier layers included in an MOS VLSI device have typically been formed in separate steps of a device fabrication sequence. This approach is relatively time-consuming and costly. Moreover, this sometimes results in the formation of a deleterious relatively high-resistivity interface between the silicide and barrier layers.

Accordingly, workers in the art have directed efforts at trying to simplify and render more effective the procedure by which the aforedescribed multilayer metallizations are made. It was recognized that such efforts, if successful, had the potential for significantly improving the performance and lowering the cost of MOS VLSI devices.

SUMMARY OF THE INVENTION

Hence, an object of the present invention is an improved fabrication procedure for making integrated circuit devices. More specifically, an object of this invention is an improved method for making a reliable low-resistance multilayer contact to silicon in an integrated circuit device.

Briefly, these and other objects of the present invention are realized in a specific illustrative embodiment thereof that comprises a multilayer contact metallization for an MOS VLSI device. By way of example, the contact structure to be fabricated on silicon comprises in order, from bottom to top, layers of titanium silicide, titanium carbide and aluminum.

In accordance with applicants' inventive fabrication sequence, the initial step in forming the afore specified multilayer contact comprises depositing on a silicon surface a titanium-rich film of titanium carbide. The deposited film is then annealed. During the annealing step, phase separation occurs. The deposited film interacts with silicon to form a titanium silicide layer. Moreover, in the same step, a layer of titanium carbide is formed directly overlying the silicide layer. Subsequently, a layer of aluminum is deposited over the titanium carbide. In that way, a reliable contact metallization for MOS VLSI devices is formed in a simplified cost-effective procedure.

Other metallization systems fall within the principles of the present invention. These other systems involve the initial deposition of a film of titanium-rich titanium nitride, titanium-rich titanium boride, hafnium-rich hafnium carbide, hafnium-rich hafnium nitride, hafnium-rich hafnium boride, zirconium-rich zirconium carbide, zirconium-rich zirconium nitride, zirconium-rich zirconium boride, tantalum-rich tantalum carbide, tantalum-rich tantalum nitride, tantalum-rich tantalum boride, niobium-rich niobium carbide, niobium-rich niobium nitride or niobium-rich niobium boride. During a heating step, each of these films deposited on silicon undergoes a phase separation to form a silicide and an overlying diffusion barrier.

BRIEF DESCRIPTION OF THE DRAWING

A complete understanding of the present invention and of the above and other features thereof may be gained from a consideration of the following detailed description presented hereinbelow in connection with the accompanying drawing, not drawn to scale, in which:

FIGS. 1 through 5 are schematic representations of a portion of an MOS VLSI device at successive stages of a fabrication sequence that embodies the principles of the present invention.

DETAILED DESCRIPTION

A portion of an MOS VLSI device at an intermediate stage of its fabrication cycle is schematically represented in cross section in FIG. 1. The particular portion shown in FIG. 1 comprises a standard gate-and-source-and-drain (GASAD) structure known in the art. The depicted structure comprises a silicon body 10 having conventional field-oxide (silicon dioxide) portions 12, 14 formed thereon. Illustratively, the vertical thickness t of the portions 12, 14 is approximately 4000-to-8000 Angstrom units (Å). In one particular example, the lateral distance D between the facing walls of the portions 12, 14 is about 4-to-5 micrometers ($\mu$m).

Further, the structure shown in FIG. 1 includes a gate-oxide (silicon dioxide) layer 16 that is about 175-to-350 Å thick and a 2500-to-4000-Å-thick doped polysilicon layer 18 that constitutes part of the gate of the MOS device. The structure also includes source and drain regions 20, 22 in the body 10.

In FIG. 1, p-n junctions between the regions 20, 22 and the main portion of the body 10 are designated by dash lines. In some shallow-junction MOS VLSI devices of practical importance, the depth of these junctions below the top surface of the body 10 is only approximately 1000-to-3000 Å.

Also shown in FIG. 1 is a patterned layer of phosphorus-doped silicon dioxide comprising regions 24 through 27 each about 10,000 Å thick. High-conductivity contacts and interconnects are intended to be made through openings formed in the phosphorus-doped silicon dioxide. In that way, electrical connections are made to the source and drain regions 20, 22 and to the doped polysilicon layer 18 of the depicted MOS device.

In accordance with the principles of the present invention, the first step in forming electrical connections to the silicon and polysilicon surfaces of the FIG. 1 structure is to clean those surfaces and then to deposit thereon a film of titanium carbide. Cleaning is done, for example, by standard backsputter etching utilizing a pure argon atmosphere. The titanium carbide film is deposited by conventional reactive radio-frequency sputtering in an argon-methane gas mixture. Illustratively, the film is so deposited in a commercially available MRC 8667 horizontal magnetron system made by Materials Research Corporation, Orangeburg, N.Y.

In accordance with applicants' invention, the titanium carbide deposited on the FIG. 1 structure is designed to be a titanium-rich film. Such a film will be designated herein as Ti$_x$C, where x is the atomic ratio of titanium to carbon and $1 < x < 5$-to-7. Different titanium-to-carbon ratios in the film are obtained by controlling deposition parameters such as power, pressure and the argon-to-methane ratio in the sputtering gas.

In accordance with the principles of the present invention, a Ti$_x$C film is sputter deposited on a surface in an argon-methane gas mixture in which the methane molar percentage in the mixture is in the range of about 0.1-to-6. Illustratively, the base pressure before the gases are introduced into the sputtering system is in the low $10^{-7}$ Torr range and the total sputtering gas pressure is in the range of about 5-to-20 milliTorr. Total radio-frequency power in the system is maintained at about 200-to-800 watts, and the peak-to-peak voltages at the target and table of the system are established at about 200-to-400 and 10-to-50 volts, respectively. By operating in these ranges, Ti$_x$C films 150-to-1000 Å thick are formed in, for example, 0.5-to-2minutes. (Of course, these parameters can vary from system to system and are to be taken only as specific examples of advantageous operating conditions in the specific aforeidentified system.)

For fabricating MOS VLSI devices, applicants have determined that a titanium-rich film having a titanium-to-carbon ratio of about 3 is preferred. There are indications that richer (i.e. $x > 3.1$) formulations are also especially useful. In particular, values as high as 5 and in some instances as high as 7 are effective. In one specific illustrative example, an x value of 3.1 was found to be particularly advantageous for depositing the titanium-rich film on $<100>$ 20 ohm-centimeter p-type silicon.

To form a Ti$_{3.1}$C film approximately 700 Å thick in a sputtering system of the type specified above, the following illustrative set of parameters is advantageous: methane molar percentage—2; total sputtering gas pressure—10 milliTorr; power—500 watts; target voltage—280 volts; and table voltage—30 volts. In FIG. 2, such a film 30 is shown deposited on the entire top surface of the depicted MOS VLSI structure.

FIG. 3 is an enlargement of a limited portion of the FIG. 2 structure. In particular, FIG. 3 is an enlargement of only that portion that extends between reference lines 32, 33 of FIG. 2. Hereinafter, only the enlarged portions respectively shown in FIGS. 3 through 5 will be utilized to describe subsequent steps in applicants' unique device fabrication sequence. But it is to be understood that the enlargements are representative of all portions of the device structure where a film of Ti$_x$C is in contact with underlying silicon or polysilicon.

Ordinarily, a diffusion barrier to aluminum is not required where the underlying semiconductor material to be contacted is relatively thick polysilicon such as the layer 18 shown in FIGS. 1 and 2. Thus, the primary applicability of the present invention for MOS VLSI devices is in making contact to source and drain regions where penetration of shallow junctions might otherwise occur due to silicon-aluminum interactions. But, in carrying out applicants' inventive fabrication sequence, it is apparent that low-resistivity connections are also made to the polysilicon layer 18. (And, of course, this would also be true for a device made utilizing silicide gate technology wherein the layer 18 is made of a silicide.)

The next step in applicants' fabrication sequence is to sinter or anneal the deposited Ti$_x$C film 30 shown in FIG. 3. Illustratively, this step is carried out at a temperature in the range of 600-to-900 degrees Celsius for one-half-to-one hour in a vacuum (approximately $10^{-6}$ Torr) or in an oxygen-free ambient such as argon, hydrogen, or nitrogen. For the particular herein-considered Ti$_{3.1}$C film, annealing at 750 degrees Celsius for 30 minutes in $10^{-6}$ Torr vacuum is advantageous.

In accordance with the principles of applicants' invention, annealing of the Ti$_x$C film 30 (FIG. 3) leads to phase separation in those portions of the film that directly overlie silicon or polysilicon. Thus, as indicated in FIG. 4, the portion of the film 30 that overlies the silicon region 20 is converted during annealing into a two-layer structure. The lower layer 32 of that structure comprises titanium silicide and the upper layer 34 comprises titanium carbide.

The layer 32 of FIG. 4 results from the interaction of silicon of the body 10 with some of the titanium constituent of the originally deposited Ti$_x$C layer. The layer 32 comprises TiSi$_2$, an effective high-conductivity contact material. The upper layer 34 comprises Ti$_y$C, where $y < x$. The layer 34 constitutes an effective barrier to aluminum diffusion. A reliable high-temperature-tolerant composite metallization for contacting silicon and for forming low-resistivity silicide-polysilicon gate-level interconnects is thereby provided.

Portions of the originally deposited film 30 in contact with the phosphorus-doped silicon dioxide regions 24, 25 remain unaffected during the aforespecified annealing step. The constituency of these portions, each designated by the reference numeral 30 in FIG. 4, remains Ti$_x$C.

In one particular illustrative case in which a Ti$_{3.1}$C film approximately 700 Å thick was deposited on an MOS VLSI structure, the thickness of the TiSi$_2$ layer 32 (FIG. 4) was about 1000 Å. In that case, the thickness of the overlying Ti$_y$C layer 34 was approximately 250 Å.

Next, in a manner well known in the art, a layer of aluminum about 0.7-to-1 μm thick is deposited over the entire top surface of the herein-considered MOS VLSI device structure. By conventional techniques (including, for example, reactive sputter etching in a plasma derived from a mixture of chlorine and boron trichloride), the aluminum layer and the underlying Ti$_x$C film are then patterned to form portions in respective registry with specified underlying regions of the device structure.

FIG. 5 shows one such patterned aluminum portion 36. As indicated, the titanium carbide layer 34 is interposed as a barrier between the aluminum portion 36 and the silicide layer 32.

Lastly, a standard passivating layer (not shown) is typically deposited on the entire top surface of the device structure illustrated in FIG. 5. This layer comprises, for example, silicon nitride or trimethyl methoxy silane (TMMS).

Other metallization systems useful for MOS VLSI devices and other applications of practical interest can be made in accordance with the principles of the present invention. These other systems involve the initial deposition of a film of titanium-rich titanium nitride, titanium-rich titanium boride, hafnium-rich hafnium carbide, hafnium-rich hafnium nitride, hafnium-rich hafnium boride, zirconium-rich zirconium carbide, zirconium-rich zirconium nitride, zirconium-rich zirconium boride, tantalum-rich tantalum carbide, tantalum-rich tantalum nitride, tantalum-rich tantalum boride, niobium-rich niobium carbide, niobium-rich niobium nitride or niobium-rich niobium boride. Standard processes are known in the art for forming such films. Upon being annealed, under the same conditions specified above for titanium-rich titanium carbide, each of these films deposited on silicon or polysilicon undergoes a phase separation. As a result of the phase separation, a two-layer structure, comprising a silicide (titanium silicide, hafnium silicide, zirconium silicide, tantalum silicide or niobium silicide) and an overlying diffusion barrier (titanium nitride, titanium boride, hafnium carbide, hafnium nitride, hafnium boride, zirconium carbide, zirconium nitride, zirconium boride, tantalum carbide, tantalum nitride, tantalum boride, niobium carbide, niobium nitride or niobium boride) is formed in a single processing step.

Finally, it is to be understood that the above-described structures and processing techniques are only illustrative of the principles of the present invention. In accordance with these principles, numerous modifications and alternatives may be devised by those skilled in the art without departing from the spirit and scope of the invention.

What is claimed is:

1. A method of making a semiconductor device, comprising the steps of
    depositing a film of $A_xB$ on a surface of a device structure that includes silicon surface regions, where A is selected from the group consisting of titanium, hafnium, zirconium, tantalum and niobium, and B is selected from the group consisting of carbon, nitrogen and boron,
    and heating said structure to convert those portions of the film that overlie silicon surface regions into a two-layer metallization comprising a layer of $ASi_2$ and an overlying layer of $A_yB$, where x is both greater than one and greater than y.

2. A method as in claim 1 wherein $1<x<5$, and further comprising
    depositing a layer of aluminum on said film, and correspondingly patterning said layer and unconverted portions of said underlying film to form composite-metallization electrical connections in said device.

3. A method as in claim 2 wherein said film comprises $Ti_xC$.

4. A method as in claim 3 wherein said film is deposited in a reactive radio-frequency sputtering system in an argon-methane gas mixture in which the methane molar percentage in the mixture is in the range of about 0.1-to-6, the total sputtering gas pressure is in the range of about 5-to-20 milliTorr and the radio-frequency power in the system is maintained at about 200-to-800 watts.

5. A method as in claim 4 wherein the heating step is carried out at a temperature in the range of approximately 600-to-900 Celsius for one-half-to-one hour in a vacuum or in an oxygen-free ambient such as argon, hydrogen or nitrogen.

6. A method as in claim 4 wherein $x=3.1$, the methane molar percentage is about 2, the total sputtering gas pressure is about 10 milliTorr and the radio-frequency power is about 500 watts.

7. A method as in claim 6 wherein the heating step is carried out at a temperature of approximately 750 degrees Celsius for 30 minutes in $10^{-6}$ Torr vacuum.

8. A method of making a semiconductor device that includes electrical connections to silicon, each connection including a silicide layer on the silicon, a diffusion-barrier layer on the silicide layer and a layer of aluminum on the diffusion-barrier layer, said method comprising the steps of
    forming a film of $Ti_xC$ on the silicon,
    in a single heating step, converting said film to a $TiSi_2$ layer on the silicon and a layer of $Ti_yC$ on the $TiSi_2$ layer, where x is both greater than one and greater than y,
    and forming a layer of aluminum on the $Ti_yC$ layer.

9. A method as in claim 8 wherein $1<x<5$.

* * * * *